United States Patent
Jang et al.

(10) Patent No.: US 9,439,286 B2
(45) Date of Patent: Sep. 6, 2016

(54) CONNECTING DEVICE FOR ELECTRONIC COMPONENT OF ELECTRONIC DEVICE

(71) Applicant: Samsung Electronics Co., Ltd., Gyeonggi-do (KR)

(72) Inventors: Young-Hoon Jang, Gyeonggi-do (KR); Kil-Nam Kim, Gyeonggi-do (KR); Sang-In Baek, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 305 days.

(21) Appl. No.: 14/035,121

(22) Filed: Sep. 24, 2013

(65) Prior Publication Data
US 2014/0102786 A1    Apr. 17, 2014

(30) Foreign Application Priority Data
Oct. 16, 2012   (KR) .................. 10-2012-0114907

(51) Int. Cl.
| H05K 1/14 | (2006.01) |
| H05K 1/18 | (2006.01) |
| H01R 4/02 | (2006.01) |
| H01R 12/70 | (2011.01) |
| H01R 12/71 | (2011.01) |
| H01R 13/24 | (2006.01) |
| H04M 1/03 | (2006.01) |

(52) U.S. Cl.
CPC .............. *H05K 1/148* (2013.01); *H01R 4/023* (2013.01); *H01R 12/7082* (2013.01); *H01R 12/714* (2013.01); *H01R 13/2435* (2013.01); *H04M 1/03* (2013.01); *H05K 1/189* (2013.01)

(58) Field of Classification Search
CPC .... H05K 5/0069; H05K 3/328; H05K 1/189; H05K 5/0056; H05K 1/148; H01L 23/5283
See application file for complete search history.

(56) References Cited

U.S. PATENT DOCUMENTS

| 5,239,198 | A | * | 8/1993 | Lin | .................. | H01L 21/56 257/691 |
| 2001/0005048 | A1 | * | 6/2001 | Krause | .............. | H01L 23/49838 257/691 |
| 2009/0243060 | A1 | * | 10/2009 | Saitoh | .................. | G01D 11/245 257/676 |
| 2010/0061736 | A1 | * | 3/2010 | Kawaguchi | .......... | H05K 1/0234 398/139 |

* cited by examiner

*Primary Examiner* — Jeremy C Norris
(74) *Attorney, Agent, or Firm* — Cha & Reiter, LLC

(57) ABSTRACT

A connecting device to connect an electronic component of an electronic device such as a portable terminal to another connection point such as a connection point of a main circuit board. The connection device includes at least a pair of conducting wires extending from the electronic component; a board connected to an end of the conducting wires; and at least two connecting members provided on one surface of the board, which are electrically coupled to the respective conducting wires. The connecting device so configured does not require a process of soldering or of coupling a connector to a socket to make a connection to the connection point, and makes it easy to standardize/commonly use an electronic component, thereby allowing the unit price of an electronic component, and the manufacturing costs of the electronic device to be reduced.

18 Claims, 5 Drawing Sheets

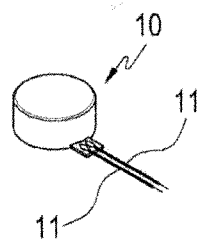
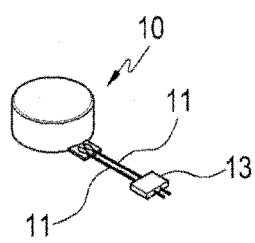
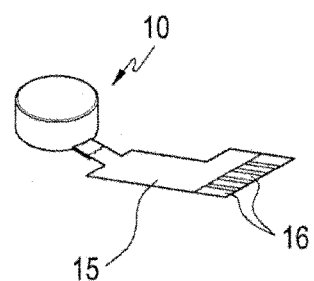
FIG.1 (PRIOR ART)
FIG.2 (PRIOR ART)
FIG.3 (PRIOR ART)
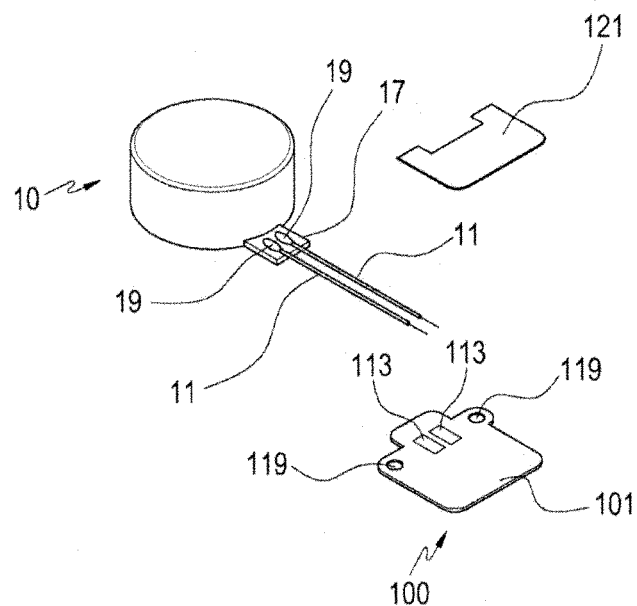
FIG.4

CONNECTING DEVICE FOR ELECTRONIC COMPONENT OF ELECTRONIC DEVICE

CLAIM OF PRIORITY

This application claims priority under 35 U.S.C. §119 to a Korean Application Serial No. 10-2012-0114907, which was filed in the Korean Intellectual Property Office on Oct. 16, 2012, the entire content of which is hereby incorporated by reference.

BACKGROUND

1. Technical Field

The present disclosure relates generally to a portable electronic device, and more particularly to a connection device for connecting an electronic component such as a vibration motor, a speaker phone, a dome sheet, or a microphone to a main circuit board of the electronic device.

2. Description of the Related Art

Portable electronic devices (herein, "portable terminals," interchangeably) such as smart phones, tablet computers, portable cameras, radios, e-book readers and the like include various circuit devices for conducting, e.g., communication and multimedia functions; and other electronic components, e.g., various input/output (I/O) devices for providing a user interface (UI). Examples of input devices include a microphone for inputting sound, a keypad for inputting characters or data, a touchscreen for inputting data and commands, and a camera; example output devices include a speaker, a display device and a flash. In addition, some products may be provided with a vibration motor for several functions, for example, call reception and schedule notification.

A portable terminal usually includes a central processing device, a storage device, a communication module and the like which are mounted on a main circuit board (hereafter also referred to as a printed circuit board (PCB)). I/O devices are disposed inside of a housing of the portable terminal separately from the PCB. Accordingly, each of the electronic components is connected to the PCB through a connecting device in the portable terminal Now, an electronic component involved with image data, such as a display device or a camera is preferably connected to the PCB through a flexible printed circuit board ("flex board") including a plurality of data lines, due to the large amount of data required in typical applications. Other I/O devices, however, such as a speaker phone, a microphone, and a vibration motor, may sufficiently perform I/O signal transfer merely using a 2-pin or 3-pin data line. Accordingly, some electronic components are usually connected to the PCB through a connecting device using conducting wires.

FIGS. 1 to 3 illustrate different ways of connecting an electronic component, 10, to a main circuit board only using a 2-pin data line. The electronic component 10 is exemplified as a vibrator motor. In FIGS. 1 and 2, the electronic component 10 is connectable to the PCB through a 2-pin data line formed by a pair of conducting wires 11. In FIG. 3, connection is made through a flex board 15 in which a 2-pin data line is implemented by a printed circuit. In the examples, the conducting wires 11 and the flex board 15 are connected to the electronic components 10 at one end and extend by a predetermined length. The lengths and shapes of the conducting wires 11 and the flex board 15 may be suitably designed according to an allotted space where the electronic component 10 is installed.

In FIG. 1, the insulating sheath of each conducting wire 11 connected to the electronic component 10 is removed at the end of the conducting wire 11 to expose the conductive core of the wire 11. The exposed core is attachable by soldering to a soldering pad (not shown) provided on the PCB to make electrical connection thereto. A shortcoming of this soldering technique, however, is that the soldering pad is added to the main circuit board, and a soldering process is separately performed, thereby adding manufacturing processes and degrading productivity. In particular, a PCB for a portable terminal where various high density integrated circuits (ICs) and the like are disposed is usually fabricated through a surface mount process. Hence soldering a conducting wire to the PCB inevitably adds a process, which increases manufacturing costs. In addition, when a conducting wire is connected to the PCB through soldering, the electronic component 10 itself such as a vibration motor should also be fixed on the PCB. The component 10 thus occupies space on the PCB, detrimentally leaving less space for an IC in a circuit layout design of the PCB.

In FIG. 2, the conducting wires 11 connected to the electronic component 10 are provided with a separate connector 13. The connector 13 is engaged with a counterpart connector, for example, a socket provided on the PCB to connect the conducting wire 11/component 10 to the PCB. Thus the component 10 can be mounted away from the PCB, thereby freeing up space for other circuitry. When the connector 13 is installed at the end of the conducting wire 11, the connector 13 may be engaged with the socket of the main board in the course of assembling the electronic component 10 to an inner surface of the portable terminal housing and assembling the PCB in the housing. However, since the unit price of such a connector is high and the installation of a corresponding socket is required, the manufacturing cost rises. A further problem is that the connection of the connector to the socket is manually performed, which reduces productivity.

FIG. 3 illustrates component 10 connected to the flex board 15, in which data pins connected with data lines 16 at the end of the flex board 15 are exposed. The end of the flex board is coupled to a connector such as the socket separately provided on the PCB to connect the data pins to the PCB. Although the flex board is flexible, it is difficult to deform it as freely as the conducting wires 11 illustrated in FIGS. 1 and 2. Accordingly, when the design of the inner space of the portable terminal is changed, the flex board that connects the electronic component to the main circuit board often needs to be redesigned, making it difficult to standardize the flex board and/or make it commonly usable. Also, as compared to a conventional conducting wire, the manufacturing cost of the flex board itself is high, resulting in higher unit costs.

SUMMARY

Accordingly, an aspect of the present invention is to provide a connecting device which may be fabricated at a low cost in connecting an electronic component of an electronic device to a circuit board of the electronic device.

Also, another aspect of the present invention is to provide a connecting device with a structure to be easily standardized/made commonly usable while connecting an electronic component to a circuit board of the electronic device.

Further, still another aspect of the present invention is to provide a connecting device capable of connecting an electronic component to a circuit board of the electronic device without the need for a separate assembling/coupling process.

In exemplary embodiments, a connecting device is provided to connect an electronic component of an electronic device such as a portable terminal to another connection point such as a connection point of a main circuit board. The connection device includes at least one conducting wire extending from the electronic component; a board connected to an end of the conducting wire; and at least one connecting member provided on one surface of the board, which is electrically coupled to the at least one conducting wire.

An exemplary embodiment of an electronic device includes a connecting device to connect an electronic component within the electronic device to another connection point within the electronic device, where the connecting device includes at least one conducting wire extending from the electronic component; board connected to an end of the at least one conducting wire; and at least one connecting member provided on one surface of the board and electrically coupled to the at least one conducting wire.

The electronic device may further include a main circuit board, where the another connection point is a connection point of the main circuit board; and the at least one connecting member is connected to the connection point, whereby the connecting device connects the electronic component to the main circuit board.

The electronic device may further include a housing, where the connecting device further comprises an adhesive member provided on a second surface of the board opposite the one surface; and the adhesive member attaches the second surface of the board to an inner surface of the housing.

The electronic device may be such that the board is disposed inside of the electronic device in a state where the at least one connecting member faces the main circuit board and connects to the connection point via an elastic member such as a C-clip that is one of a part of the connection member itself or a separate elastic member.

The electronic device include a guide rib formed on the housing, where the guide rib surrounds the board of the connecting device.

The at least one wire of the electronic device can be at least two wires extending from the electronic component, the at least one connecting member can be a plurality of connecting members, where the plurality of connecting members are electrically coupled to ends of the at least two conducting wires, respectively.

The electronic component may be one of a vibration motor, a speaker phone, a dome sheet, and a microphone.

BRIEF DESCRIPTION OF THE DRAWINGS

The above and other aspects, features, and advantages of the present invention will be more apparent from the following detailed description taken in conjunction with the accompanying drawings, in which:

FIG. 1 is a perspective view illustrating an electronic component having a connecting device structure according to a first example of prior art;

FIG. 2 is a perspective view illustrating an electronic component having a connecting device structure according to a second example of prior art;

FIG. 3 is a perspective view illustrating an electronic component having a connecting device structure according to a third example of prior art;

FIG. 4 is an exploded perspective view illustrating a connecting device of an electronic component according to an exemplary embodiment of the present invention;

DETAILED DESCRIPTION

Hereinafter, various embodiments of the present invention will be described with reference to the accompanying drawings. In the following description, a detailed description of known functions and configurations incorporated herein will be omitted to avoid obscuring the present invention.

It is to be understood that in this disclosure, including the Claims section, the singular forms "a," "an," and "the" include plural references unless the context clearly dictates otherwise. Thus, for example, a reference to "a component surface" includes reference to one or more of such surfaces.

Figure 5:
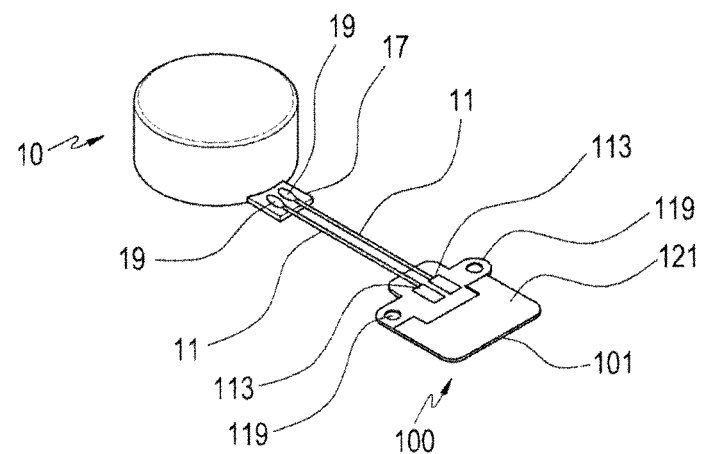
FIG. 5 is a perspective view illustrating the connecting device of the electronic component illustrated in FIG. 4.
Figure 6:
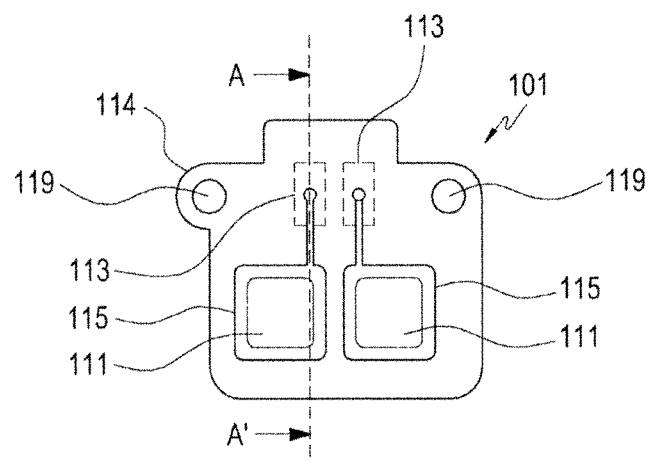
FIG. 6 is a plan view illustrating one surface of the connecting device illustrated in FIG. 5.
Figure 7:
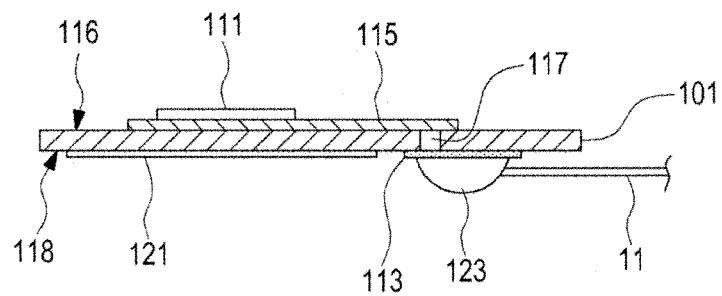
FIG. 7 is a cross-sectional view of the connecting device illustrated in FIG. 6 taken along line A-A'.

Referring collectively to FIGS. 4 to 7, an electronic component connecting device 100 according to an exemplary embodiment of the present invention (also referred to herein as a "connection structure" 100) includes conducting wires 11 connected at a far end to the electronic component 10, or just extending from the electronic component 10, a board (e.g., a substrate) 101 provided at a near end of the conducting wires 11, and a connecting member 111 provided on one surface of the board 101 (see FIGS. 6 and 7). It is noted that when describing the exemplary embodiments of the present invention, the electronic component 10 and conducting wires 11 are assumed to have the same constructions as those illustrated in FIG. 1, thus the same legends are used.

Figure 10:
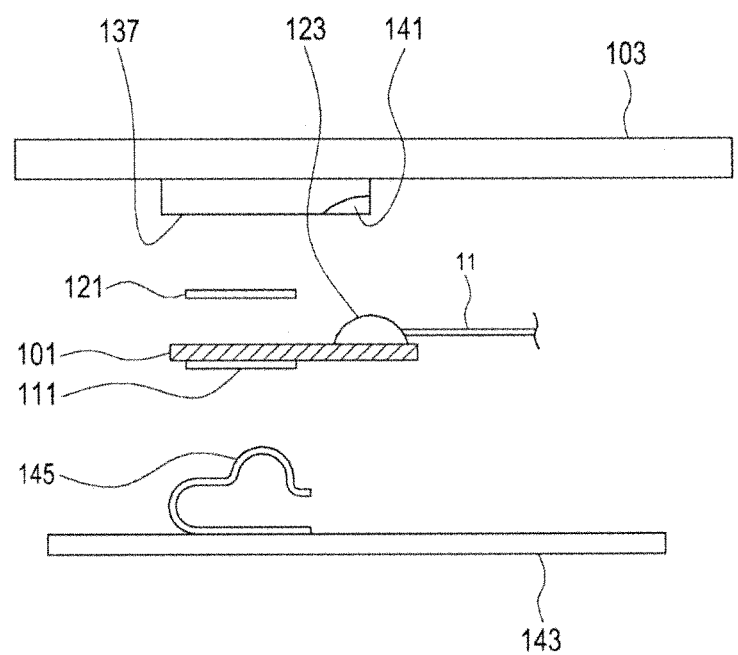
FIG. 10 is a configurational view for describing a structure for connecting the connecting device illustrated in FIG. 9 to a main circuit board of the portable electronic device.

In the various figures, electronic component 10 is exemplified as a vibration motor; however, the inventive connecting device 100 may be used for connecting a speaker phone, a "dome switch", a microphone or the like as well as the vibration motor to a main circuit board 143 (see FIG. 10). In general, any electronic component capable of performing an input/output function with a 2-pin or 3-pin data line may be connected to a main circuit board ("PCB") 143 of a portable electronic device or the like through the inventive connecting device 100. Connection structure 100 can also be used in fixed electronic devices.

Note that the above-mentioned dome switch may be a dome switch of a keypad for inputting numerals and characters. However, since this keypad generally requires multiple data lines, in this case it is desirable to connect the dome sheet to the PCB through a connecting device that uses a flex board. In other applications, the dome sheet can be installed in a 2-direction key for adjusting volume, a power key, a camera shutter key, a hot key for performing a specific function, and so forth.

Each of the conducting wires 11 has a core wrapped by a sheath. The far end of each conducting wire 11 is fixed to one of soldering pads 19 provided on the electronic component 10. Soldering pads 19 are formed on a connection tab 17 provided on one side of the electronic component 10. After the far ends of the conducting wires 11 are fixed to soldering pads 19 by soldering, silicon resin or the like is preferably coated and cured thereon to protect the soldered part. As described above, since the electronic component 10 is connected to the main circuit board 143 through a 2-pin or 3-pin data line, the conducting wires 11 are preferably formed in at least one pair. Since the conducting wires 11 may freely change shape, wiring may be freely performed even when the design of the inner space of a portable terminal or the like is varied.

It is further noted, in an alternative embodiment, instead of soldering the wires 19 to the connection tab 17, the component 10 may be provided pre-fabricated with wires 11 extending therefrom, with or without the connection tab 17. For instance, connection of the wires 11 to the component 10 could be done internally to the housing of component 10.

Figure 9:
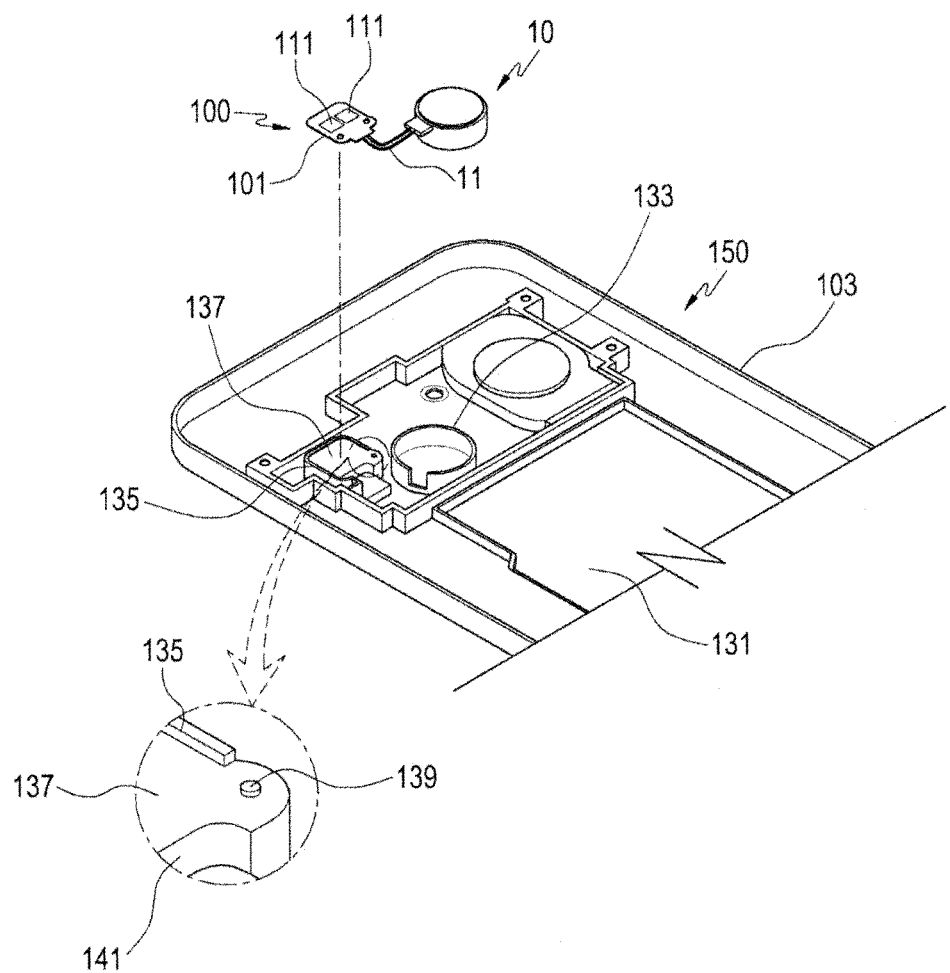
FIG. 9 is a perspective view illustrating a situation in which an electronic component with the connecting device illustrated in FIG. 5 is assembled to a housing of a portable electronic device.

As for the board 101, in one embodiment, a rigid board may be used. In another embodiment, the board 101 is be fabricated using a film for a flexible printed circuit board (i.e., the board 101 can be a flex board). Preferably the board 101 has an asymmetric shape so that it can be attached without error in a predetermined (correct) direction when the board 101 is assembled to a housing or other structure in the portable terminal (hereafter, the surface to which the board 101 is attached is called the "inner housing surface"). For example, the board 101 may be formed in a substantially square shape which may be provided with a curvilinear protrusion at a corner portion of one side, as shown in FIGS. 4-6. Referring momentarily to FIG. 9, in this case, a guide rib 135 corresponding to the shape of the board 101 may be formed in the inside of a housing 103 of a portable terminal 150 where the board 101 is secured. As a result, even without being especially aware of the assembling direction of the board 101, a worker may affix the board 101 to the housing 103 such that the connecting members 111 properly face the intended target device, e.g., a connection point of main circuit board 143. In addition, the board 101 may be provided with alignment holes 119 through which are engaged with alignment lugs 139 formed on the inside of the housing or the like. With this arrangement, it is easy to set an assembling position of the board 101 and stably fix the board 101. It is desirable to form at least one pair of the alignment holes 119 on the board 101.

Meanwhile, in order to secure the board 101 to the inner housing surface, the connecting device 100 may be provided with an adhesive member 121. The adhesive member 121 may be formed by a double-sided tape provided on a surface portion of the board 101. However, according to an assembling process, adhesive may be coated on the surface portion of the board 101 or the inner housing surface. That is, without using the adhesive member 121 such as double-sided tape, the board 101 may be attached and fixed to the inner housing surface using adhesive.

Hereafter, for clarity of explanation, one surface of the board 101 to which the wires 11 are physically connected will be arbitrarily called a bottom surface 118 (which can also be considered a "first major surface"), and the opposite surface will be arbitrarily called a top surface 116 ("second major surface"). The first and second major surfaces are each significantly larger than the lateral side surfaces of the board. Top surface 116 is provided with the connecting members 111, which are electrically coupled to the wires 11 through via holes 117. Soldering pads 113 are disposed on bottom surface 118 to provide means for connecting and fixing the conducting wires 11 to the board 101. That is, the conducting wires 11 are connected and fixed to the board 101 by soldering. After the ends of the conducting wires 11 are fixed to the board 101 by soldering, it is desirable to coat and cure a silicon resin or the like to protect soldering part 123.

Figure 8:
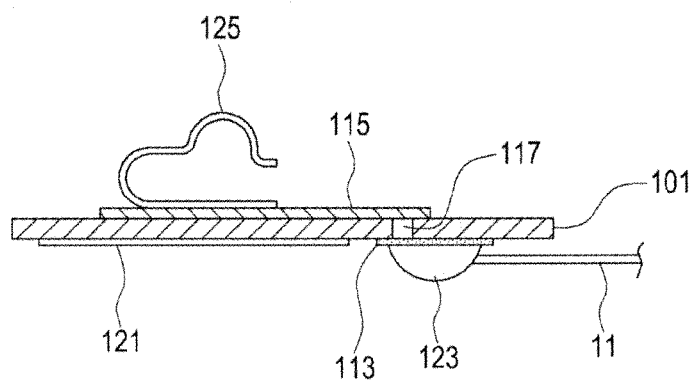
FIG. 8 is a cross-sectional view illustrating a modified example of the connecting device illustrated in FIG. 7.

On top surface 116, a printed circuit pattern (i.e., conductor) 115 may be formed. The connecting members 111 may be formed as a flat pad as illustrated in FIGS. 6 and 7, or formed as an elastic terminal member such as a C-clip 125 as illustrated in FIG. 8. The connecting members 111 are mounted on and fixed to the pattern 115 formed on the board 101. When the connecting members 111 are formed by a flat pad, a terminal member such as a C-clip electrically connectable thereto is disposed on the main circuit board 143. Conversely, when the connecting member 111 is formed by a terminal member such as C-clip 125, a flat pad is disposed on the main circuit board 143 for connection to the C-clip 125. Although not illustrated, also in forming a soldering pad 113 on the bottom surface 118, a second printed circuit pattern may be formed on bottom surface 118 and the soldering pad 113 may be mounted on and fixed to the second printed circuit pattern.

The via hole 117 (see FIG. 7) may be formed in the board 101 to electrically connect the soldering pad 113 to the printed circuit pattern 115. Consequently, the soldering pad 113 is connected to the connecting member 111 sequentially through the via hole 117 and the printed circuit pattern 115. As a result, the conducting wires 11 connected to the other surface of the board 101 are electrically coupled to the connecting members 111, respectively.

Hereinbelow, a description is presented for a configuration in which the electronic component 10 having the connecting device 100 is assembled to the housing of the portable terminal. A configuration in which the electronic component 10 is connected to the main circuit board 143 or the like disposed in the housing is also described, with reference to FIGS. 9 and 10.

FIG. 9 illustrates the electronic component 10 having the connecting device 100 while being assembled to the housing of the portable terminal. FIG. 9 illustrates the rear case 103 in the housing of a portable terminal 150, in which the rear case 103 is provided with a battery mounting recess 131. Structures for fixing the electronic component 10 and the connecting device 100 are formed on the inner surface of the rear case 103.

Portable terminal 150 is an example of an electronic device within which connecting device 100 is employed, and can be, e.g., a smart phone, a tablet computer, a camera, a radio and/or television reception device, a music player, a personal digital assistant, a recording device, a laptop, an e-book reader, etc.

To fix the electronic component 10 within portable terminal 150, a first guide rib 133 is formed on the inner surface of the rear case 103. The electronic component 10 is fixed to the housing of the portable terminal, more specifically to the inner surface of the rear case 103 in a position surrounded by the first guide rib 133. By providing an adhesive member such as a double-sided tape on one surface of the electronic component 10, the electronic component 10 may be attached and fixed to the inner surface of the rear case 103.

To fix the board 101, a second guide rib 135 is provided on the inner surface of the rear case 103. The second guide rib 135 is provided in a shape suitable to surround the board 101. However, when one side corner 114 of the board 101 (refer to FIG. 6) has a protruding curvilinear shape, a part of the second guide rib 135 may be provided in a partially opened shape. Accordingly, the board 101 is installed in a state where the protruding curvilinear part 114 is positioned at the opened part of the second guide rib 135. That is, as described above, the board 101 is fabricated in an asymmetric shape, and the second guide rib 135 is formed to correspond to the shape of the board 101 to set a correct direction where the board 101 is assembled.

Now, a seat surface 137 for supporting the board 101 may be formed inside of the rear case 103. The seat surface 137 is provided at a position protruding from the inner surface of the rear case 103 and substantially surrounded by the second guide rib 135. The seat surface 137 is formed with at least one alignment lug 139. As described above the alignment lugs 139 are engaged with the alignment holes 119 formed on the board 101. The board 101 is positioned on the seat surface 137 in the state where the alignment holes 119 and the alignment lugs 139 are engaged with each other. When so positioned, the adhesive member 121 provided on the bottom surface 118 of the board 101 attaches and fixes the board 101 to the seat surface 137.

Moreover, the seat surface 137 may be formed with a dodging groove 141. As described above, the conducting wires 11 are connected and fixed to the bottom surface 118 of the board 101 by soldering, and as desired, the soldering part is protected by a silicon resin or the like. It is unavoidable that such a soldering part protrudes from the bottom surface of the board 101 (unless a recessed structure on board 101 is alternatively used for the soldering connection space). The protruding soldering part may be an obstacle in attaching the other surface of the board 101 to the seat surface 137. Accordingly, when the dodging groove 141 is formed, the other surface of the board 101 may be tightly contacted with the seat surface 137.

FIG. 10 illustrates a configuration in which the board 101 is positioned facing the main circuit board 143 in the state where it is to be fixed to the rear case 103. Here, a flat pad is exemplified as the connecting member 111 provided on the board 101, and a C-clip 145 is disposed on the main circuit board 143. The C-clip 145 holds an elastic force and thus, prior to mechanical engagement with connecting member 111, is partially maintained at a predetermined position from the main circuit board 143. When the main circuit board 143 is assembled in portable terminal 150 to face the inner surface of the rear case 103, the connecting member 111 is positioned to face the C-clip 145. In other words, the board 101 is assembled to the rear case 103 in such a manner that the connecting member 111 faces the main circuit board 143. (It is noted here that the board 101 could alternatively be connected to a sub circuit board, not shown, instead of the main circuit board 143.)

Now, the distance between the main circuit board 143 101 and the rear case 103 in the finally assembled position is set to be smaller than the maximum height of the C-clip 145 from the main circuit board 143 (as measured in a non-engaged state). Accordingly, the C-clip 145 is electrically connected to the connecting member 111, and the elastic force of the C-clip 145 maintains the connected state of the C-clip 145 and the connecting member 111.

The connecting device 100 as described above does not require a separate soldering or coupling process in relation to the main circuit board 143. That is, the electronic component 10 is connectable to the main circuit board 143 only by assembling the electronic component 10 and the board 101 of the connecting device 100 to the housing, more specifically to the rear case 103 and disposing and fixing the main circuit board 143 to the rear case 103.

In addition, since the board 101 and the electronic component 10 are connected by the conducting wires 11, a wiring path in the rear case 103 may be flexibly made. In addition, if the conducting wires 11 are embodied as stranded wires, the distance between the board 101's main surface and the electronic component 10 at the final assembly position may be reduced. That is, at the final assembly position, the distance between the board 101's main surface and the electronic component 10 may be adjusted by twisting one of the conducting wires 11 into another of the conducting wires 11. Thereafter, the inner space of the rear case 103 may be arranged to be efficiently used, in accordance with the designed distance between the seat surface 137 and the first guide rib 133. Accordingly, the inventive connecting device 100 of the electronic component 10 may be equivalently used even when the inner space of the portable terminal is changed and thus the standardization/common use of the electronic component may be enabled.

The electronic component connecting device configured as described above is provided with a connecting member at a board (e.g., substrate or PCB) providing a fixed connection to an end of a conducting wire. A flexible connecting structure may be formed between the electronic component and a connecting circuit board of the portable terminal. In other words, the electronic component may be connected to the connecting circuit board merely by assembling the circuit board to a housing of a portable terminal in the state where the electronic component provided with the inventive connecting device is fixed to the housing of the portable terminal. Accordingly, there is an advantage in that a process of soldering or of coupling a connector to a socket is not required, thus, manufacturing costs may be reduced. In addition, since a board and an electronic component may be connected by conducting wires and the conducting wires may be freely deformed, the electronic component may be commonly used in portable terminals in which inner spaces are designed differently. That is, the inventive connection device facilitates standardization of an electronic component/makes it commonly usable, which allows the unit price of an electronic component, and the manufacturing costs of a portable terminal to be reduced.

While the present invention has been shown and described with reference to certain embodiments thereof, it will be understood by those skilled in the art that various changes in form and details may be made therein without departing from the spirit and scope of the present invention as defined by the appended claims. For instance, instead of assembling board 101 to a rear case as described above, in alternative configurations, board 101 could be assembled to a front case or to a side case or case portion, if available in a particular electronic device design. Board 101 could also be fixed to another structure within the electronic device housing instead of the housing itself, if another structure is employed in a particular design. In another application, wires 11 may be replaced by a single wire, or by three or more wires.

What is claimed is:

1. A connecting device to connect an electronic component within an electronic device to another connection point, comprising:
    at least one conducting wire extending from the electronic component;
    a board connected to an end of the at least one conducting wire;
    at least one connecting member provided on a first surface of the board and electrically coupled to the at least one conducting wire; and
    at least one pad provided on a second surface of the board opposite to the first surface,
    wherein the board is affixed such that the at least one connecting member faces the connecting point, and
    wherein the end of the at least one conducting wire is fixed to the at least one pad.

2. The connecting device of claim 1, wherein the electronic component is one of a vibration motor, a speaker phone, a dome sheet, and a microphone.

3. The connecting device of claim 1, wherein the board is a flexible printed circuit board.

4. The connecting device of claim 1, wherein the at least one connecting member is a conductive pad.

5. The connecting device of claim 1, wherein the at least one connecting member is a C-clip.

6. The connecting device of claim 1, wherein the at least one pad includes at least one soldering pad.

7. The connecting device of claim 6, further comprising at least one via hole formed through the board,
wherein the at least one soldering pad is electrically coupled to the at least one connecting member through the at least one via hole.

8. The connecting device of claim 6, further comprising at least one printed circuit pattern formed on the first surface of the board,
wherein the at least one connecting member is electrically coupled to at least one via hole through the at least one printed circuit pattern.

9. The connecting device of claim 1, wherein the board has an asymmetric shape.

10. The connecting device of claim 1, further comprising at least one pair of alignment holes formed through the board at positions proximate to an edge of the board.

11. The connecting device of claim 1, further comprising an adhesive member provided on a second surface of the board opposite the first surface.

12. The connecting device of claim 1, wherein the at least one wire is at least two wires extending from the electronic component, the at least one connecting member is a plurality of connecting members, and the plurality of connecting members are electrically coupled to ends of the at least two conducting wires, respectively.

13. An electronic device, comprising:
a connecting device to connect an electronic component within the electronic device to another connection point within the electronic device, the connecting device comprising:
at least one conducting wire extending from the electronic component;
a board connected to an end of the at least one conducting wire;
at least one connecting member provided on a first surface of the board and electrically coupled to the at least one conducting wire;
at least one soldering pad provided on a second surface of the board opposite the first surface; and
an adhesive member provided on the second surface,
wherein the end of the at least one conducting wire is fixed to the at least one soldering pad.

14. The electronic device of claim 13, further comprising a main circuit board, wherein:
the another connection point is a connection point of the main circuit board;
the at least one connecting member is connected to the connection point, whereby the connecting device connects the electronic component to the main circuit board.

15. The electronic device of claim 13, further comprising a housing, wherein
the adhesive member attaches the second surface of the board to an inner surface of the housing.

16. The electronic device of claim 14, wherein the board is disposed inside of the electronic device in a state where the at least one connecting member faces the main circuit board and connects to the connection point via an elastic member that is one of a part of the connection member itself or a separate elastic member.

17. The electronic device of claim 13, wherein the electronic device includes a guide rib formed on a housing thereof, and the guide rib surrounds the board of the connecting device.

18. The electronic device of claim 13, wherein the at least one wire is at least two wires extending from the electronic component, the at least one connecting member is a plurality of connecting members, and the plurality of connecting members are electrically coupled to ends of the at least two conducting wires, respectively.

* * * * *